United States Patent
Chen et al.

(10) Patent No.: US 6,891,274 B2
(45) Date of Patent: May 10, 2005

(54) UNDER-BUMP-METALLURGY LAYER FOR IMPROVING ADHESION

(75) Inventors: William Tze-You Chen, Endicott, NY (US); Ho-Ming Tong, Taipei (TW); Chun-Chi Lee, Kaohsiung (TW); Su Tao, Kaohsiung (TW); Jeng-Da Wu, Kaohsiung Hsien (TW); Chih-Huang Chang, Tainan Hsien (TW); Po-Jen Cheng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/604,794

(22) Filed: Aug. 18, 2003

(65) Prior Publication Data

US 2004/0113273 A1 Jun. 17, 2004

(30) Foreign Application Priority Data

Sep. 10, 2002 (TW) ........................................ 91120546 A

(51) Int. Cl.⁷ .......................... H01L 23/48; H01L 29/40; H01L 23/52
(52) U.S. Cl. .................... 257/780; 257/737; 257/778; 257/738; 257/762; 257/763; 257/764; 257/768; 257/784; 257/786; 257/765; 257/766; 257/779
(58) Field of Search ................................. 257/780, 738, 257/737, 777, 762–768, 779, 778, 784, 786

(56) References Cited

U.S. PATENT DOCUMENTS

| | | | | |
|---|---|---|---|---|
| 6,413,851 | B1 | * | 7/2002 | Chow et al. ............... 438/613 |
| 6,417,089 | B1 | * | 7/2002 | Kim et al. ................. 438/612 |
| 6,501,185 | B1 | * | 12/2002 | Chow et al. ............... 257/780 |
| 2002/0185733 | A1 | * | 12/2002 | Chow et al. ............... 257/737 |
| 2003/0057551 | A1 | * | 3/2003 | Datta et al. ................ 257/737 |
| 2003/0080392 | A1 | * | 5/2003 | Zuniga-Ortiz et al. ...... 257/503 |
| 2003/0116845 | A1 | * | 6/2003 | Bojkov et al. .............. 257/738 |
| 2003/0162380 | A1 | * | 8/2003 | Tong et al. ................. 438/613 |
| 2003/0164552 | A1 | * | 9/2003 | Tong et al. ................. 257/779 |
| 2003/0189261 | A1 | * | 10/2003 | Tong et al. ................. 257/780 |
| 2003/0219987 | A1 | * | 11/2003 | Wang et al. ................ 438/720 |
| 2004/0035909 | A1 | * | 2/2004 | Yeh et al. .................. 228/56.3 |

* cited by examiner

Primary Examiner—Alexander Oscar Williams
(74) Attorney, Agent, or Firm—Jianq Chyun IP Office

(57) ABSTRACT

An under-bump-metallurgy layer is provided. The under-bump-metallurgy layer is formed over the contact pad of a chip and a welding lump is formed over the under-ball-metallurgy layer. The under-bump-metallurgy layer comprises an adhesion layer, a barrier layer and a wettable layer. The adhesion layer is directly formed over the contact pad. The barrier layer made from a material such as nickel-vanadium alloy is formed over the adhesion layer. The wettable layer made from a material such as copper is formed over the barrier layer. The wettable layer has an overall thickness that ranges from about 3 μm to about 8 μm.

25 Claims, 1 Drawing Sheet

UNDER-BUMP-METALLURGY LAYER FOR IMPROVING ADHESION

CROSS REFERENCE TO RELATED APPLICATIONS

This application claims the priority benefit of Taiwan application serial no. 91120546, filed Sep. 10, 2002.

BACKGROUND OF INVENTION

1. Field of Invention

The present invention relates to an under-bump-metallurgy layer. More particularly, the present invention relates to an under-bump-metallurgy layer that can improve the mechanical strength of a barrier layer therein.

2. Description of Related Art

In this information-hungry society, electronic products are used almost everywhere to meet our demands for communication, business transactions, education, recreation and much more. The principle drivers behind all these electrical devices are specially designed integrated circuits. As electronic technologies continue to advance, increasingly complex, functionally powerful and highly personalized electronic products are produced. Rapid progress in design has also brought about the current trend of product miniaturization. Many types of high-density semiconductor packages are developed using flip-chip technique. Since a flip-chip packages utilize the bump on each contact pad of a chip to make direct electrical contact with a substrate, average circuit length is shorter than other types of packages connected through the wire bonding or the tape automated bonding (TAB) method. The shortened circuit length improves overall performance of a flip-chip package over other conventional packages. Furthermore, the backside of the chip in a flip-chip package may be exposed by design to increase heat dissipation. Because of these advantages, flip-chip techniques for fabricating packages are adopted by most semiconductor package producers.

FIG. 1 is a magnified cross-sectional view of a portion of a conventional flip-chip package structure. As shown in FIG. 1, the flip-chip structure 100 includes a silicon chip 100 and a plurality of welding bump structures 170 (only one is shown in FIG. 1). Each welding bump structure 170 comprises an under-bump-metallurgy (UBM) layer 142 and a bump 160. The chip 110 has an active surface 112. The active surface 112 of the chip 110 has a passivation layer 114 and at least one contact pad 116 thereon. The passivation layer 114 has at least one opening 118 that exposes the contact pad 116. The under-ball-metallurgy (UBM) layer 142 is formed on the contact pad 116 of the chip 110. The UBM layer 142 includes an adhesion layer 120, a barrier layer 130 and a wettable layer 140. The adhesion layer 120 sits directly on the contact pad 116, the barrier layer 130 is over the adhesion layer 120 and the wettable layer 140 is over the barrier layer 130. The adhesion layer 120 is made from a material such as titanium or aluminum, the barrier layer 130 is made from a material such as nickel-vanadium alloy and the wettable layer 140 is made from a material such as copper. The bump 160 sits on the wettable layer 140. The bump is made from a material such as lead-tin alloy.

In general, the aforementioned flip-chip package structure 100 has a thin wettable layer 140 of between 0.3 to 0.8 $\mu$m. Moreover, the copper in the wettable layer 140 may react quickly with the tin inside the bump 160. At the end of the copper-tin reaction, the tin within the bump 160 may further react with the nickel inside the barrier layer 130. Since the inter-metallic layer formed by the relatively slow reaction (more than 30 seconds) between tin and nickel is lumpy and discontinuous, ultimate contact with the adhesion layer 120 will be poor. Hence, the bump 160 may easily peel off from the upper surface of the chip 110.

SUMMARY OF INVENTION

Accordingly, one object of the present invention is to provide an under-ball-metallurgy layer that can improve the mechanical strength of a barrier layer therein and prevent a bump on the barrier layer from peeling off from an underlying chip.

Before starting out to describe this invention, the spatial preposition "over" or "above" needs to be clarified. When the preposition "over" or "above" is used, the relationship between the two objects concerned may or may not have direct contact with each other. For example, an object A is "over" or "above" an object B may mean either object A is above object B and directly touching object B or object A is in the space above object B but without touching object B.

To achieve these and other advantages and in accordance with the purpose of the invention, as embodied and broadly described herein, the invention provides an under-ball-metallurgy layer formed over a contact pad on a chip. A bump is formed over the under-ball-metallurgy layer. The under-ball-metallurgy layer comprises an adhesion layer, a barrier layer and a wettable layer. The adhesion layer is formed over the contact pad. The barrier layer made from a material such as nickel-vanadium alloy is formed over the adhesion layer. The wettable layer is formed over the barrier layer and the bump is formed over the wettable layer. The wettable layer is made from a material such as copper and has a thickness between about 3 $\mu$m to about 8 $\mu$m.

In one preferred embodiment of this invention, the adhesion layer is made from a material such as titanium, titanium-tungsten alloy, aluminum or chromium. The adhesion layer has a thickness between about 0.1 $\mu$m to about 1 $\mu$m. Similarly, the barrier layer has a thickness between about 0.1 $\mu$m to about 1 $\mu$m. The barrier layer is formed, for example, by sputtering. The wettable layer is formed, for example, by sputtering and electroplating or simply by conducting an electroplating process alone.

In brief, since the wettable layer is a relatively thick layer ranging between 3 to 8 $\mu$m, reaction time between copper and tin is extended. Hence, the amount of platy and discontinuous inter-metallic material resulting from the reaction between nickel and tin is restricted. Ultimately, bonding strength between the bump and the chip is increased.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
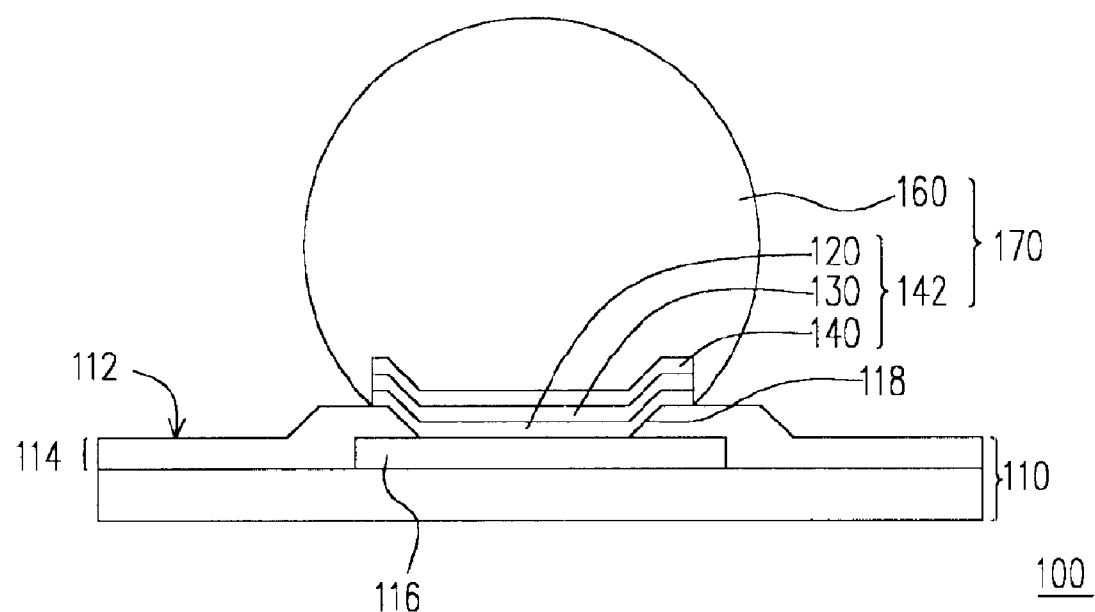
FIG. 1 is a magnified cross-sectional view of a portion of a conventional flip-chip package structure.

Reference will now be made in detail to the present preferred embodiments of the invention, examples of which are illustrated in the accompanying drawings. Wherever possible, the same reference numbers are used in the drawings and the description to refer to the same or like parts.

Figure 2:
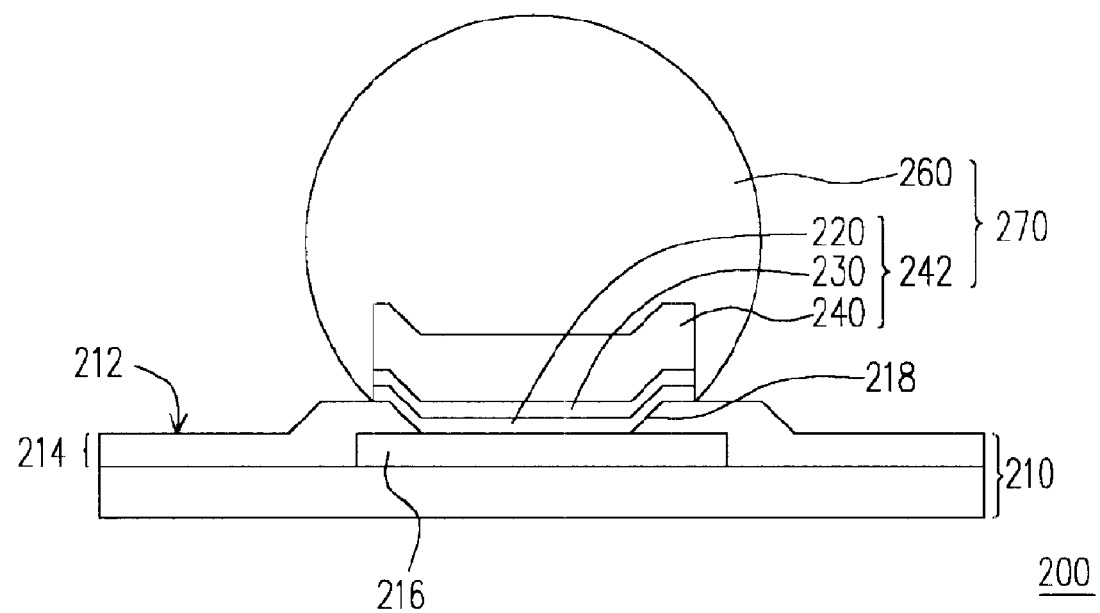
FIG. 2 is a magnified cross-sectional view of a portion of a flip-chip package structure according to one preferred embodiment of this invention.

FIG. 2 is a magnified cross-sectional view of a portion of a flip-chip package structure according to one preferred embodiment of this invention. The flip-chip package 200 in FIG. 2 includes a chip 210 and a plurality of welding bump structures (only one is shown). Each welding bump structure 270 comprises an under-bump-metallurgy (UBM) layer 242 and a bump 260. The chip 210 has an active surface with a passivation layer 214 and a plurality of contact pads (only one is shown) 216 thereon. The passivation layer 214 has a plurality of openings 218 and each of the openings 218 exposes a contact pad 216. The passivation layer 214 is fabricated using an inorganic material such as silicon oxide, silicon nitride or phosphosilicate glass (PSG). Alternatively, the passivation layer 214 may be a composite layer comprising of a stack of the aforementioned inorganic compound layers. Furthermore, the passivation layer 214 may also be an organic compound layer such as a polyimide layer. The contact pads 216 are fabricated from a material such as copper or aluminum.

The under-ball-metallurgy layer 242 is formed over the contact pads 216 on the chip 210. The under-ball-metallurgy layer 242 includes an adhesion layer 220, a barrier layer 230 and a wettable layer 240. The adhesion layer 220 is fabricated using a material such as titanium, titanium-tungsten alloy, aluminum or chromium. The adhesion layer 220 is formed, for example, by sputtering over the contact pad 216 to a thickness of between 0.1 to 1 $\mu$m. The barrier layer 230 is fabricated using a material such as nickel-vanadium alloy. The barrier layer 230 is formed, for example, by sputtering over the adhesion layer 220 to a thickness between about 0.1 $\mu$m to about 1 $\mu$m. The wettable layer 230 is fabricated using a material such as copper. The wettable layer 230 is formed, for example, by electroplating or electroplating and sputtering over the barrier layer 230 to a thickness between about 3 $\mu$m to about 8 $\mu$m.

The bump 260 is formed over the wettable layer 240. The bump 260 can be made from a material such as lead-tin alloy. However, the bump 260 can also be made from a lead-free material such as tin, gold, copper-tin alloy, tin-technetium alloy, tin-bismuth alloy, tin-indium alloy, tin-zinc alloy, tin-silver alloy, tin-bismuth-silver alloy, tin-bismuth-technetium alloy, tin-bismuth-zinc alloy, tin-bismuth-indium alloy or tin-silver-copper alloy.

Reference material for fabricating the under-ball-metallurgy layer 220 and the bump 230 can be found in co-pending U.S. patent application filed on 2002 May 3, Ser. No. 10/063,574, titled "BUMP MANUFACTURING METHOD", U.S. patent application filed on 2003 Jan. 22, Ser. No. 10/248,464, titled "BUMP FORMING PROCESS", U.S. patent application filed on 2002 Dec. 26, Ser. No. 10/248,197, titled "BUMP MANUFACTURING METHOD", U.S. patent application filed on 2003 Jan. 17, Ser. No. 10/248,411, titled "METHOD OF MODIFYING TIN TO LEAD RATIO IN TIN-LEAD BUMP", U.S. patent application filed on 2003 Feb. 26, Ser. No. 10/248,863, titled "SOLDER BALL FABRICATING PROCESS", U.S. patent application filed on 2003 Feb. 12, Ser. No. 10/248,715, titled "SOLDER BALL FABRICATION PROCESS", or U.S. patent application filed on 2003 Feb. 27, Ser. No. 10/248,882, titled "LEAD-FREE BUMP FABRICATION PROCESS", all of which are assigned to the same assignee and all disclosures of which are incorporated herewith by reference. Since the process of fabricating the under-ball-metallurgy layer 242 and the bump 260 should be familiar to those skilled in the art, detailed description of the process is omitted here. Note that thickness of the wettable layer 240 must be sufficiently thick, preferably in the range between 3 to 8 $\mu$m.

In the aforementioned flip-chip package structure 200, the wettable layer 240 is a relatively thick layer having a thickness ranging between 3 to 8 $\mu$m. With such thickness, reaction time between copper and tin is extended, thereby reducing the formation of a platy and discontinuous intermetallic layer through prolonged reaction between nickel and tin. Ultimately, bonding strength between the bump and the chip is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An under-ball-metallurgy layer, comprising:
    an adhesion layer;
    a barrier layer over the adhesion layer, wherein the barrier layer is fabricated using a nickel-vanadium alloy; and
    a wettable layer over the barrier layer, wherein the wettable layer is fabricated using copper and has a thickness between about 3 to about 8 $\mu$m.

2. The under-ball-metallurgy layer of claim 1, wherein material constituting the adhesion layer is selected from a group consisting of titanium, titanium-tungsten alloy, aluminum and chromium.

3. The under-ball-metallurgy layer of claim 1, wherein the adhesion layer has a thickness between about 0.1 to about 1 $\mu$m.

4. The under-ball-metallurgy layer of claim 1, wherein the barrier layer has a thickness between about 0.1 to about 1 $\mu$m.

5. The under-ball-metallurgy layer of claim 1, wherein the barrier layer is formed by sputtering.

6. The under-ball-metallurgy layer of claim 1, wherein the wettable layer is formed by electroplating.

7. The under-ball-metallurgy layer of claim 1, wherein the wettable layer is formed by sputtering and electroplating.

8. A flip-chip structure, comprising:
    a chip having an active surface with a passivation layer and a plurality of contact pads thereon, wherein the passivation layer has a plurality of openings and each said opening exposes a contact pad;
    an under-ball-metallurgy layer over the contact pad, including:
    an adhesion layer;
    a barrier layer over the adhesion layer, wherein the barrier layer is fabricated using a nickel-vanadium alloy; and
    a wettable layer over the barrier layer, wherein the wettable layer is fabricated using copper and has a thickness between about 3 to about 8 $\mu$m; and
    a plurality of bumps on each wettable layer.

9. The flip-chip structure of claim 8, wherein material constituting the adhesion layer is selected from a group consisting of titanium, titanium-tungsten alloy, aluminum and chromium.

10. The flip-chip structure of claim 8, wherein the adhesion layer has a thickness between about 0.1 to about 1 μm.

11. The flip-chip structure of claim 8, wherein the barrier layer has a thickness between about 0.1 to about 1 μm.

12. The flip-chip structure of claim 8, wherein the barrier layer is formed by sputtering.

13. The flip-chip structure of claim 8, wherein the wettable layer is formed by electroplating.

14. The flip-chip structure of claim 8, wherein the wettable layer is formed by sputtering and electroplating.

15. The flip-chip structure of claim 8, wherein material constituting the passivation layer includes an inorganic compound.

16. The flip-chip structure of claim 8, wherein material constituting the passivation layer includes high molecular weight polymer.

17. The flip-chip structure of claim 8, wherein material constituting the bump includes a lead-tin alloy.

18. The flip-chip structure of claim 8, wherein material constituting the bump includes a lead-free alloy.

19. The flip-chip structure of claim 18, wherein material constituting the bump is selected from a group of metals consisting of tin, gold, silver, copper, bismuth, antimony, indium, zinc or various combinations of the metals.

20. An under-ball-metallurgy layer, at least comprising:

an adhesion layer;

a barrier layer sputtered over the adhesion layer; and a wettable layer over the barrier layer, wherein the wettable layer is fabricated using copper and has a thickness between about 3 to about 8 μm.

21. The under-ball-metallurgy layer of claim 20, wherein material constituting the adhesion layer is selected from a group consisting of titanium, titanium-tungsten alloy, aluminum and chromium.

22. The under-ball-metallurgy layer of claim 20, wherein the adhesion layer has a thickness between about 0.1 to about 1 μm.

23. The under-ball-metallurgy layer of claim 20, wherein the barrier layer has a thickness between about 0.1 to about 1 μm.

24. The under-ball-metallurgy layer of claim 20, wherein the wettable layer is formed by electroplating.

25. The under-ball-metallurgy layer of claim 20, wherein the wettable layer is formed by sputtering and electroplating.

* * * * *